US 6,624,524 B1

(12) United States Patent
Madurawe

(10) Patent No.: US 6,624,524 B1
(45) Date of Patent: Sep. 23, 2003

(54) LASER ALIGNMENT TARGET

(75) Inventor: Raminda U. Madurawe, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/420,253

(22) Filed: Oct. 18, 1999

Related U.S. Application Data

(60) Continuation of application No. 09/041,921, filed on Mar. 13, 1998, now Pat. No. 6,002,182, which is a division of application No. 08/770,927, filed on Dec. 23, 1996, now Pat. No. 5,998,295.
(60) Provisional application No. 60/015,119, filed on Apr. 10, 1996.

(51) Int. Cl.⁷ .................... H01L 23/48; H01L 23/52; H01L 29/40
(52) U.S. Cl. .................... 257/797; 257/713; 257/752; 257/773
(58) Field of Search .................. 257/797, 739, 257/753, 784, 723, 734, 774, 773, 752; 438/401, 462, 975

(56) References Cited

U.S. PATENT DOCUMENTS

| | | | |
|---|---|---|---|
| 4,609,986 A | 9/1986 | Hartmann et al. | 364/200 |
| 4,617,479 A | 10/1986 | Hartmann et al. | 307/465 |
| 4,677,318 A | 6/1987 | Veenstra | 307/465 |
| 4,713,792 A | 12/1987 | Hartmann et al. | 364/900 |
| 4,871,930 A | 10/1989 | Wong et al. | 307/465 |
| 4,884,123 A | 11/1989 | Dixit et al. | 257/764 |
| 4,899,067 A | 2/1990 | So et al. | 307/465 |
| 4,912,342 A | 3/1990 | Wong et al. | 307/465 |
| 4,933,303 A | 6/1990 | Mo | 257/778 |
| 5,069,749 A | 12/1991 | Gutierrez | 438/675 |
| 5,121,006 A | 6/1992 | Pedersen et al. | 307/465 |
| 5,241,224 A | 8/1993 | Pedersen et al. | 307/465 |
| 5,247,478 A | 9/1993 | Gupta et al. | 365/185 |
| 5,260,610 A | 11/1993 | Pedersen et al. | 307/465 |
| 5,260,611 A | 11/1993 | Cliff et al. | 307/465 |
| 5,294,975 A | 3/1994 | Norman et al. | 356/401 |
| 5,350,954 A | 9/1994 | Patel et al. | 307/465 |
| 5,354,712 A | 10/1994 | Ho et al. | 438/648 |
| 5,488,007 A | 1/1996 | Kim et al. | 438/643 |
| 5,518,960 A | 5/1996 | Tsuchimoto | |
| 5,567,650 A | 10/1996 | Straight et al. | 438/629 |
| 5,621,246 A | * 4/1997 | Motoyama | 257/736 |
| 5,712,207 A | 1/1998 | Lee et al. | 438/628 |
| 6,002,182 A | * 12/1999 | Madurawe | 257/797 |

OTHER PUBLICATIONS

TLSI "Design Guidelines for Laser Fusing of ID Tags," Feb. 19, 1991, 7 pages.
Xilinx Programmable Logic Data Book, chapter entitled "XC4000, XC4000A, XC4000H Logic Cell Array Families", 1994, Revised Apr. 1995, pp. 2–7 to 2–46.
Article in E E Times, "DAC Briefs: Chip Express Introduces Laser–Programming Arrays," Jun. 10, 1996, 1 page.
Article in Elec. Buyers' News, "LPGAs: An 'In–Between' Solutn.," Jul. 1, 1996, 1 page.
Chip Express Press Release, "The Chip Express QYH500 Laser Gate Array (LPGA) Family Now Supports 3–Volt Custom Designs," Santa Clara, CA, May 17, 1996, 1 page.

(List continued on next page.)

Primary Examiner—Jasmine J B Clark
(74) Attorney, Agent, or Firm—Townsend and Townsend and Crew LLP

(57) ABSTRACT

A technique to form a structure with a rough topography (415) in a planarized semiconductor process. The rough topography (415) is formed by creating cored contacts (433). Subsequent process layers may be further stacked on top of the cored contacts in order to augment nonplanar characteristics of the cored contacts. This rough topography structure may be used to align integrated circuits and wafers. An integrated circuit may be laser aligned using this alignment structure.

20 Claims, 5 Drawing Sheets

OTHER PUBLICATIONS

Chip Express Press Release, "Chip Express Unviels a 200,000 Gate LPGA Family with Configurable Embedded SRAM: The CX2000 New Gate Array Architecture Eases Deep Sub–micron Designs," Las Vegas, NV, Jun. 3, 1996, 2 pages.

Chip Express Press Release, "Chip Express Annouces Low-Production Volumn OneMask® Gate Arrays Screened to Military Standard 883: Rapid–Turn Laser–Prototyping Used by the Military," Santa Clara, CA, Aug. 21, 1995, 2 pages.

World Wide Web Chip Express Page, About Chip Express Technology Overview, 6 pages, 1996.

World Wide Web Chip Express Page, Product & Services "Production Technologies," 2 pages, 1996.

World Wide Web Chip Express Page, Product & Services "Protoyping with LPGA," 3 pages, 1996.

Smith, et al., "Laser Programmable Redundancy and Yield Improvement in a 64K DRAM," IEEE Journal of SolidState Circuits, vol. SC–16, No. 5, Oct. 1981, pp. 506–513.

* cited by examiner

LASER ALIGNMENT TARGET

This Application is a CON of 09/041,921, filed Mar. 13, 1998, U.S. Pat. No. 6,002,182 which is a DIV of 08/770,927 filed Dec. 23, 1996, U.S. Pat. No. 5,998,295 which claims benefit of 60/015,119 filed Apr. 10, 1996.

BACKGROUND OF THE INVENTION

The present invention relates generally to the field of integrated circuit fabrication. More specifically, the present invention is structure and a technique for fabricating a structure useful for aligning a wafer, substrate, or integrated circuit die.

There are many circumstances where aligning a wafer or integrated circuit die is important. For example, alignment is important during the processing of integrated circuits. Integrated circuits are fabricated using a layer-by-layer process. Alignment may be critical during the processing of certain layers, where these layers must to aligned properly in relationship to previous layers. For example, a contact layer must be aligned properly with a first conductor layer in order to create contacts at the correct locations. Contacts formed at the wrong locations may create shorts or opens, and reduce yield.

Proper alignment is also critical in many other situations. These include testing of,an integrated circuit die on a wafer. The die must be positioned properly in order to properly probe the device.

Moreover, alignment is also important when programming or configuring an integrated circuit. For example, a die may have fuses that are to be laser programmed. The fuses may be made of polysilicon, or another conductor. This fuse may couple together two (or more) devices or conductors. A laser with sufficient energy is directed at the fuse. The laser "blows" the fuse, decoupling the two devices or conductors. In order for the laser to properly reference the coordinates of a fuse, the integrated circuit must be aligned properly. When the integrated circuit is not aligned properly, the laser may damage or destroy a portion of the circuitry instead of blowing the desired fuse. Therefore, the alignment of an integrated circuit or wafer is especially critical.

A wafer or integrated circuit die may need to be aligned properly in an X-direction, Y-direction, rotation angle, and other orientation. As technology improves, alignment is becoming more important and critical, especially resulting from the continued scaling and shrinking of semiconductor device geometries. Integrated circuits (or "chips") have progressively become smaller and denser, and any small misalignment will adversely affect the integrated circuit yield and functionality of the integrated circuit.

One technique of alignment is by use of an alignment target. An alignment target should have good reflective or optical contrast so it can be easily identifiable. For example, a laser may be used to determine a change in reflectivity or optical contrast in a semiconductor structure used as the alignment target. This contrast may be achieved by forming a region with rough topography and a region with a smooth topography, where these regions are in close proximity to one another. Light is reflected from the smooth or planar region while light is scattered from the rough region. A laser alignment system would find this alignment target and align the wafer or integrated circuit based on the target.

In order to facilitate the fabrication of smaller device sizes, current process technologies emphasize relatively smooth or planar topographies. Smooth topographies allow better step coverage and allow packing of devices and geometries closer together. Some of the techniques used to form flat topographies include such processing techniques as chemical-mechanical polishing (CMP). With CMP, process layers (e.g., dielectrics) are mechanically polished with a slurry mixture to form a very flat topography. A further technique includes plug technology (e.g., tungsten plug technology), where a plug material is used to fill contacts or vias, or both, in order to minimize step coverage (i.e., metal step cover over plugs may be near 100 percent). Plug technology further emphasizes a flat or planar topography.

Despite the substantial success of such planarized process technologies, these processes also meet with certain limitations, especially when used to create a region having good reflectivity, which may be used as an alignment target. With flat or smooth topographies, the resulting structures and regions will have a similar optical reflectiveness. This leads to poor reflective or optical contrast, making it difficult (and possibly impossible) to align a wafer or integrated circuit die, especially by using laser. Furthermore, in some processes, metals use antireflective coatings, further reducing the reflectivity contrast over flat topography.

As can be seen, a structure and technique for fabricating a good reflective contrast is needed, especially where this structure is useful as an alignment target for aligning a wafer or integrated circuit.

SUMMARY OF THE INVENTION

The present invention is a structure and technique for fabricating a structure having good reflective contrast for use as an alignment structure. In particular, a technique of the present invention is for fabricating a structure having a rough topography using a planarized semiconductor process. The rough topography structure of present invention has a different reflectivity compared to a smooth or planar topography structure. Specifically, the rough topography will scatter incident radiation and light, while the smooth topography will reflect radiation and light. A structure including both rough and smooth topographies may be used as an alignment target for aligning an integrated circuit or wafer. The system will be able to identify the reflective and optical contrast between the smooth and rough topography. After alignment, an integrated circuit, such as a memory, microprocessor, or programmable logic device, may be programmed, such as by a laser to blow laser-programmable fuses.

The technique of the present invention includes forming an initial cored region in a plug filling a contact opening. This cored region is nonplanar and has a depression in about the middle of the contact opening. Subsequent process layers are formed on top of this depression. The subsequent process layers also have a depression and are nonplanar above the cored region in the contact layer. The subsequent process layers generally aggravate or augment the nonplanar characteristics of the cored region. Also, subsequent via layers may also be cored, similar to the contact layer, to further enhance the roughness of the topography.

More specifically, the method of forming a rough topography on a substrate using a planarized process of the present invention includes the following steps. A contact opening is formed where a lateral dimension of the contact opening exceeds a minimum contact size. The contact opening is filled with a first plug layer. The first plug layer is etched back to create a first cored region in the first plug layer. The first cored region has a first depression. A subsequent process layer is formed and stacked on the first cored region. The subsequent process layer has a second depression formed on top of the first depression. In a specific embodiment, at least one lateral dimension of the contact opening exceeds about 1.5 times the minimum contact size.

Moreover, an alignment structure for semiconductor fabrication of the present invention includes a smooth and a rough region formed on a substrate. The rough region includes a first conductive layer and a second conductive layer formed above the first conductive layer. A first insulating layer is formed between the first and second conductive layers. The first insulating layer has a first opening for electrically coupling the first and second conductive layers. A plug layer, having a cored region, fills the first opening. The topographical roughness formed by the cored region scatters incident radiation.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
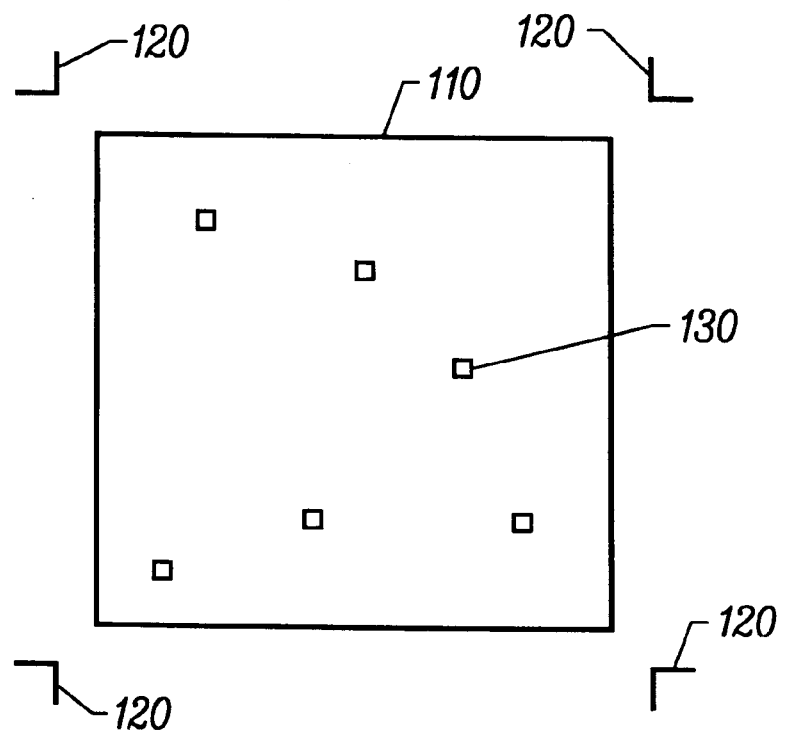
FIG. 1 shows alignment targets and an integrated circuit with programmable fuses.

FIG. 1 is a diagram of an integrated circuit 110 and alignment targets 120. Integrated circuit 110 may be one of many on a wafer. Alignment targets 120 are used to align the integrated circuit. For example, alignment targets 120 may be used in the laser alignment of integrated circuit 110. Alignment targets 120 may also be used to align other objects and structures, such as entire wafers.

In the embodiment in FIG. 1, the alignment targets are shown as L-shaped structures. Many other shapes and sizes of alignment targets may be used including crosses ("X's"), pluses ("+'s"), and tees ("T's"), just to name a few. The shape and size of the structure are selected to permit easy and precise alignment.

For more precise alignment, the alignment targets should be positioned relatively close to the structure to be aligned. Specifically, in FIG. 1, alignment targets 120 are placed adjacent to, but outside integrated circuit 110. Moreover, for example, alignment targets 120 may be in a die seal or scribe line adjacent particular dies within a wafer.

In further embodiments of the present invention, the alignment targets may also be placed within integrated circuit 110. In some circumstances, this may be necessary because of the processing requirements. Further, this may be necessary, for example, when aligning integrated circuit dies which have already been sawed from the wafer. However, having alignment targets within the integrated circuit may be somewhat undesirable because it reduces the amount of usable area within the integrated circuit.

Alignment targets may be used to align multiple or groupings of integrated circuit dies at the same time. For example, an array of two rows by three columns of integrated circuit dies may use the same set of alignment targets. Since more than one die may be "group aligned" simultaneously, this approach may save time when aligning the integrated circuits. Also, since fewer alignment targets are needed, less area is used by the alignment targets, so more dies may be placed on a wafer. This technique may be used in a multiple-die reticle field. As all the die in a reticle field are exposed at one time, there is no relative variation between the die. However, different reticle steppings may have movement variations; then, separate alignment is typically required.

For alignment, a pair of alignment targets may be used, such as shown in FIG. 1. However, there may be any number of alignment targets, sufficient to allow for precise and accurate alignment. The integrated circuit may need to be aligned in several different directions and angles, including, for example, an X-direction, Y-direction, and rotation angle. The number and shape of the alignment targets should be selected to allow the desired alignment approach.

A particular application, among many others, where alignment of integrated circuits is especially important is the laser programming of fuses within the dies. As shown in FIG. 1, there may be one of more fuses 130 within the integrated circuit. Each may control a particular feature. For example, fuse-programmable options may be used to repair against low-level defects in integrated circuits. If a defect is found in a particular circuit, then after the integrated circuit has been aligned using the alignment targets, a laser is referenced to a selected fuse location with the integrated circuit. The laser "blows" the fuse, which may be made of polysilicon or metal, in order to enable or disable the appropriate circuitry.

Alignment is especially critical since the laser must properly reference the precise location on the integrated circuit to program the fuse. For example, fuses may occupy less than 100 square micron area. Any misalignment error, and the laser may damage a portion of the integrated circuit.

Laser programming may also be employed in implementing redundancy of integrated circuit chips. With redundancy, some defective elements of a die can be replaced with nondefective extra resources provided for the repair. The accuracy of the replacement depends on the accuracy of laser programming.

Laser programming may be useful for configuring various types of integrated circuits including, but not limited to, memories, microprocessor, ASICs, gate arrays, field programmable gate arrays (FPGAs), and programmable logic devices (PLDs). For example, for PLDs, laser programming may be used to configure the logical elements and interconnections within between the logical elements. PLDs are typically programmed by electrically programming fuses, antifuses, EPROM, Flash, EEPROM, or SRAM cells.

Programmable logic integrated circuits and their operation are well known to those of skill in the art. See, for example, U.S. Pat. No. 4,617,479, incorporated herein by reference for all purposes. Such devices are currently represented by, for example, Alterals MAX® series of PLDs and FLEX® series of PLDs. The former are described in, for example, U.S. Pat. Nos. 5,241,224 and 4,871,930, and the *Altera Data Book*, March 1995, all incorporated herein by reference. The latter are described in, for example, U.S. Pat. Nos. 5,258,668, 5,260,610, 5,260,611 and 5,436,575, and also the *Altera Data Book*, March 1995, all incorporated herein by reference for all purposes.

Laser programming may be used in place of, or to supplement, the electrical configuration of PLDs. For example, laser programming may be used to program the programmable interconnect array (PIA), global interconnect, local interconnect, and other interconnection within a PLD. Laser programming may also be used to configure the functionality of logic array blocks (LABs) and logic elements (LEs). As a further example, a look-up table in a PLD may be configured by the way of laser programming.

The integrated circuit may be programmed in part by laser programming, then further electrically configured or programmed by a user. The user may program the device using a programmer device or using in-system programming (ISP). ISP involves electrically programming an integrated circuit while it resides on a system board. For example, a laser may program a portion of the global interconnect; and if desirable or necessary, the remaining portion of the global interconnect is configured in the field (i.e., by a customer or user).

Laser programming may be used to implement some features which are typically implemented using mask-programmable options. Mask-programmable options are features of the integrated circuit which are enabled or disabled by using an appropriate mask during a masking step. These options are usually implemented during a metal masking step, such as first or second metal layers. Although mask-programmable options are an effective technique, laser programming offers many advantages. For example, among other advantages, laser programming may lower overall production cost since integrated circuit dies do not need to be laser programmed until just before the parts are needed. Generic (unconfigured) parts may be stored in inventory and laser configured as needed. This eliminates the need of keeping an inventory in various customized and specialized products.

Figure 2A:
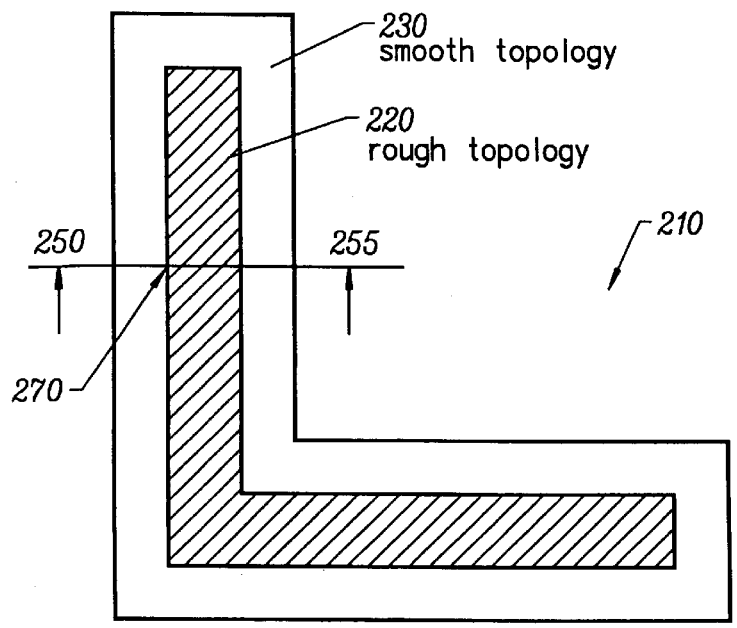
FIG. 2A shows a top view of an alignment structure of the present invention.

FIG. 2A shows an embodiment of an alignment target 210 of the present invention. Here, alignment target 210 is an "L" shape; however, as discussed above, the alignment target may be many other shapes. Alignment target 210 may be mirrored, rotated, and positioned as desired on the wafer or integrated circuit.

Alignment target 210 includes a rough topography 220 and a smooth topography 230. Rough topography 220 and smooth topography 230 have a dissimilar optical reflectiveness. Generally, smooth topography 230 reflects incident radiation or light while rough topography 220 scatters incident radiation or light. Furthermore, on a wafer, especially one processed using a planarized process, areas (e.g., substrate, active regions) other than rough topography 220 will generally be highly reflective regions like smooth topography 230.

Figure 2B:
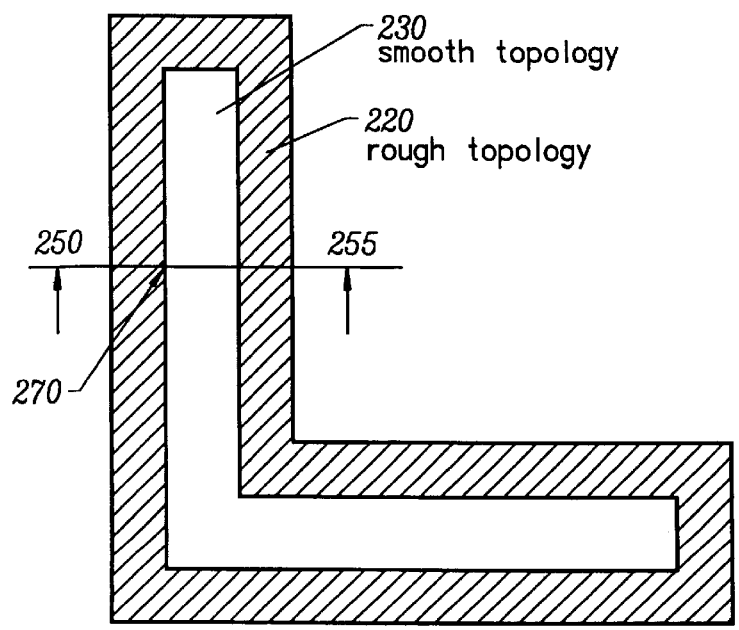
FIG. 2B shows a top view of another embodiment of an alignment structure of the present invention.

FIG. 2B illustrates an alternative embodiment of the alignment structure. In this embodiment compared to FIG. 2A, rough topography regions 220 are reversed with smooth topography regions 230. Use and fabrication of this alignment structure would be analogous to that for the structure shown in FIG. 2A.

An alignment system (which may use a laser) scans alignment target 210 and can recognize a difference in reflectivity between rough topography 220 and smooth topography 230. Using alignment target 210, the alignment system makes adjustments to position the wafer or integrated circuit into proper alignment. For example, a laser may scan alignment target 210 along a line and direction from 250 to 255. While scanning the alignment target, the scanning instruments will detect the difference in reflectivity between rough topography 220 and smooth topography 230. The reflectivity changes at an interface 270 between rough topography 220 and smooth topography 230.

In addition, there should be adequate space around the alignment mark so that circuitry or other features may not be mistaken for the alignment mark. Furthermore, the laser alignment may scan multiple times, such as in the X and Y directions. And, there may be multiple scan marks. In a preferred embodiment, three alignment marks are used. A more precise alignment will result when using four or more targets.

Consequently, it is desirable that there is a high degree of reflective contrast between the smooth topography 230 and rough topography 220. Specifically, it is especially important to fabricate a rough topography which has less reflectivity than the smooth topography. This poses a significant problem when using planar process technologies.

Figure 3:
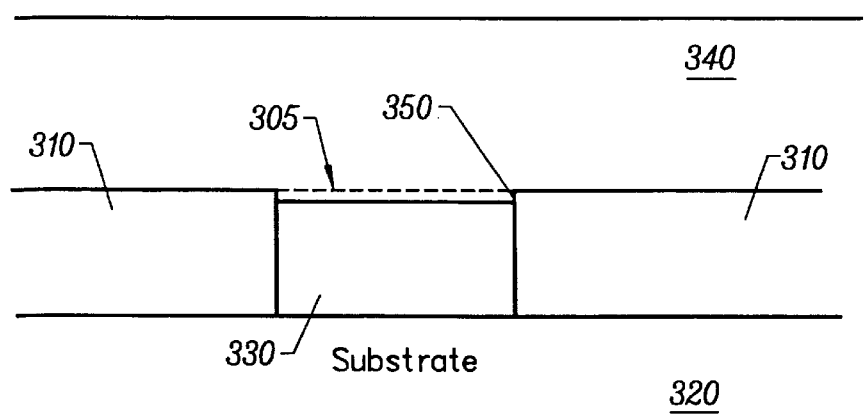
FIG. 3 shows a cross-section of a planarized plug and contact opening.

As described in the Background section, a planarized process emphasizes planar topographies. This leads to poor reflective contrast between different materials and structures. For example, FIG. 3 shows a contact 305 formed using a planarized process with plug technology. Contact opening 305 is formed through oxide 310 to substrate 320. Substrate 320 is typically silicon, but may be another material such as germanium or gallium arsenide.

Contact opening 305 is filled with a plug 330, which is a conductive material. Plug 330 is typically tungsten. Plug 330 may be formed using other materials and alloys such as titanium and titanium-tungsten. Effectively, plug layer 330 couples a layer, above and electrically contacting plug 330, to a layer below and electrically contacting plug 330. For example, in FIG. 3, plug layer 330 electrically couples a first metal layer 340 to substrate 320. This type of connection may be used to, for example, ground the substrate.

Plug layer 330 helps produce a flatter topography. Compared to a process without a plug layer, a step 350 between plug 330 and oxide 310 is minimized. Therefore, the resulting topography is smoother and flatter. As a result, subsequent layers stacked over plug layer 330, oxide 310, and step 350 will also be smoother and more planar. In some processes, the topography may even be planarized further by chemical-mechanical polishing (CMP), where the surface of oxide layer 310 is polished (or ground) to ensure its flatness. Therefore, using a planar process, its becomes increasingly difficult to create a rough regions on layer 340 which may be used as an alignment target.

Plug technology may be used similarly for vias between two metal layers. A plug material would fill the via and minimize a step between the oxide and via opening. This helps produce a planar topography in a similar way for vias as described above for contact openings.

Figure 4:
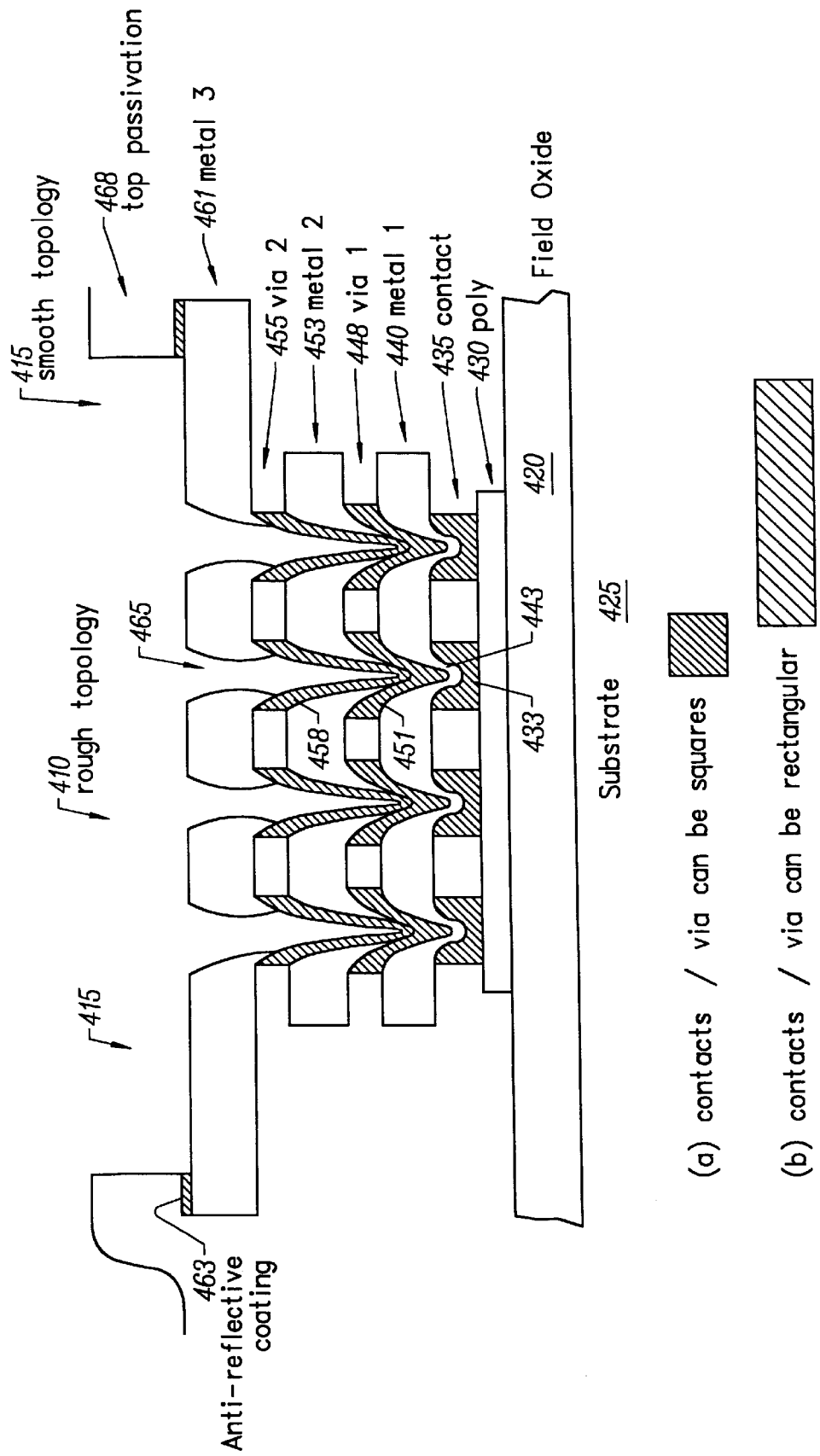
FIG. 4 shows a cross-section of an alignment structure of the present invention.

FIG. 4 shows a cross-sectional view of alignment target 230 along the line 250 to 255 of FIG. 2A. A region with rough topography 410 has on either side, regions with smooth topography 415. This rough topography structure may be formed using a planarized process.

In the present invention, to form a rough topography region 410, a field oxide layer 420 is formed on a substrate 425. By forming the structure on field oxide, this helps ensure that the substrate is not accidentally shorted. A polysilicon layer 430 is formed on field oxide layer 420. A contact opening 433 having a lateral dimension exceeding a minimum contact size is formed in an oxide layer above polysilicon 430 to create a contact layer 435. As shown, there may be multiple contact openings 433 in contact layer 435 depending on the size of the structure desired.

The process technology defines a minimum contact size. In a planarized process, non-minimum-sized contacts are not typically permitted since the process has been optimized for minimum-sized contacts. Further, using minimum-sized contacts reduces die size. The minimum contact size may be embodied in a design rule for the layout. For example, a minimum contact size may be about one micron. In order to minimize contact resistance, a number of minimum-sized contacts may be used to contact two different materials. Furthermore, this minimum contact size applies to the lateral dimensions; so, a minimum-sized contact typically is a square structure.

In contrast, in rough topography region 410, at least one lateral dimension of the contact opening exceeds a minimum contact size. Therefore, a shape of the contact opening may be rectangular (or other shape), and not necessarily square. For example, if the minimum contact size is one micron, contact opening 433 may have one lateral dimension of 1.5 microns. In a specific embodiment of the present invention, the nonminimum lateral dimension of contact opening 433 should be at least about 1.5 times larger than the minimum contact size. For example, for a 1.0 micron minimum, contact opening 433 should have a lateral dimension of about 1.5 microns or greater. Generally, the larger the contact opening, the bigger the depression in the cored region.

Figure 5:
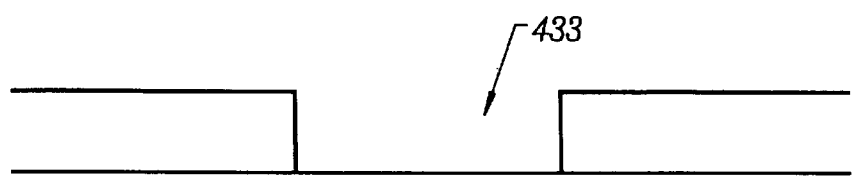
FIG. 5 shows a cross-section of a contact opening.
Figure 6:
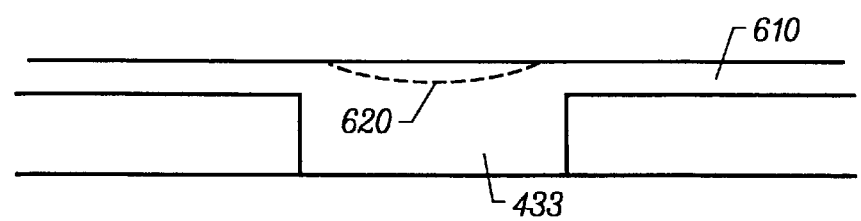
FIG. 6 shows a cross-section of a plug layer filling a contact opening.

FIGS. 5, 6, 7, and 8 show the process steps in more detail. FIG. 5 shows contact opening 433. FIG. 6 shows how contact opening is filled with a first plug layer 610. First plug layer 610 is deposited over the entire surface of the wafer. First plug layer 610 is "etched back" to the contact opening. The etch back process results in a removal of the first plug layer as indicated by dashed line 620. After etch back, for a minimum-sized contact opening, the result is the substantially planarized plug surface as shown in FIG. 3. The surface may be planarized further using chemical-mechanical polishing.

Figure 7:
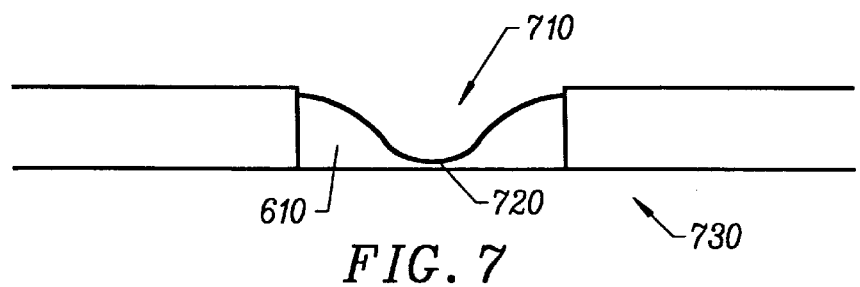
FIG. 7 shows a cross-section of coring in the plug of a contact opening.

In contrast, for a larger than minimum contact opening, the result is shown in FIG. 7. More specifically, the etch back step creates a nonplanar, cored region 710 in the plug at about the middle of the contact opening. The cored region has a first depression 720. In some cases, etch back may also result in the first depression extending into a process layer 730 beneath the contact. For example, referring to the structure shown in FIG. 4, the first depression could extend into polysilicon layer 430. Because it is nonplanar, the cored region will scatter incident light. By forming a plurality of cored regions (such as shown in FIG. 4) in a plurality of contact openings, a rough topography region may be formed on the wafer.

Figure 8:
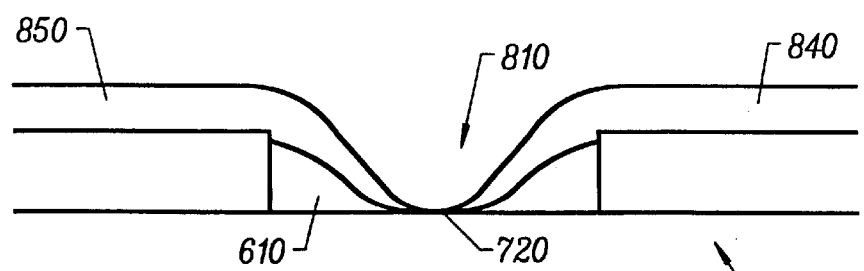
FIG. 8 shows a cross-section of coring in a conductor layer over the contact opening.

FIG. 8 shows the plug created by the process sequence shown in FIG. 7 after deposition of a top metal 840. Due to cored region 720 of plug 610, metal step coverage is poor in a region 810. Compared to a relatively flat portion 850 of metal 840, region 810 forms a rough topography region. Metal (especially when processed without antireflective coatings) provides a very good reflective property on smooth topography 850, but scatters incident light over rough topography 810.

As discussed above to form a cored region, a contact opening should be larger than minimum size. In a specific embodiment, a lateral dimension of the contact opening should be approximately 1.5 times or larger than the minimum size. For example, if the minimum contact size in 1.0 micron, to form a cored region, the contact opening should be about 1.5 microns or greater.

Returning to FIG. 4, contact opening 433 has a plug layer which has a cored region having a depression, similar to that described for FIG. 7. By stacking subsequent process layers on top of this cored plug region, this aggravates the coring and depression, and the roughness is magnified.

In FIG. 4, a metal-1 layer 440 is formed above contact layer 435 and contact 433. The resulting metal-1 layer 440 is nonplanar over cored region of contact 433, and has a second depression 443. This further enhances the roughness of the topography.

Vias may also be formed using a planarized plug technology, similar to that described for contacts. Specifically, an oxide layer is formed above metal-1 layer 440 to create a via-1 layer 448. A plug layer in a via-1 opening 451 is etched back and cored. As in the case of a contact opening, to facilitate the coring, this via opening is greater than minimum size. And in a specific embodiment of the present invention, the via opening should be about 1.5 times or greater a minimum via size. The coring of via-1 layer 448 is exaggerated because the via opening is formed top of the depression in metal-1 and cored region of contact 433. This further enhances roughness.

A metal-2 layer 453 is formed on top of via-1 layer 448. Similar to metal-1 layer 440, metal-2 layer 453 will be nonplanar and have a depression in the cored region. In fact, at this point in the processing, due to the severe depressions caused by stacking layers over the cored regions, step coverage over the depressed regions may be so severe that metal-2 does not entirely cover the plug layer in via-1 opening 451.

Further process layers are similarly formed above the cored regions, and will aggravate the coring further, leading to even greater roughness in the topography. For a three-layer metal process, a via-2 layer 455 is formed above metal-2 layer 453. The plug layer in a via-2 opening 458 is etched back and cored. A metal-3 layer 461 is subsequently formed over via-2 layer 455. As shown in FIG. 4, the step coverage may be extremely severe so metal-3 layer becomes discontinuous and not cover the plug layer in via-2 opening 458. Note that a void 465 may be formed above the cored regions due to severe step coverage caused by the cored regions.

In other embodiments of this invention it may not be necessary to have multiple stacking layers to provide the final surface for light reflection contrast. For example, in a three-layer metal process, a stack formed using (metal-3)-(via-2)-(metal-2) may be sufficient to create enough surface roughness for contrast. In another example of five-layer metal process, a stack formed using (metal-5)-(via-4)-(metal-4)-(via-3)-(metal-3) may be required to provide the necessary surface roughness.

The structure and typically the entire wafer is covered with a passivation or insulating layer 468. Layer 468 may be a single layer material such as oxynitride, or multiple layers of material such as oxide, nitride, and polyimide. Passivation layer 468 may have cracks (not shown) over the cored regions 465. Passivation layer 468 over the alignment structure may be moved to enhance the difference in the reflectivity between the smooth and rough regions. In a specific embodiment, the passivation is removed from over rough region. This process also removes an antireflective coating 463 from the metal enhancing reflectivity from smooth topography regions.

The topographically rough region formed, as described above, will scatter incident radiation, in contrast to a topographically smooth region, which reflects light. This difference in reflectivity, or reflectivity contrast, may be used by an alignment system for aligning integrated circuits and wafers.

The foregoing description of preferred embodiments of the invention has been presented for the purposes of illustration and description. It is not intended to be exhaustive or to limit the invention to the precise form described, and many modifications and variations are possible in light of the teaching above.

For example, although described for a three-layer metal process, the technique and structure of the present invention will be equally applicable to a single-metal and double-metal process. In those cases, the contact layer is cored, and subsequent via layers, if any, are also cored. This would result in structure with a rough topography useful for an alignment structure.

Furthermore, varying degrees of contrast in reflectivity may be achieved by selecting or limiting the number of layers which are cored. For example, in a three-layer metal process, only the via-1 layer may be cored to create a region with a first degree of reflectivity. In another region, the contact and via-1 layers may be cored to create a second degree of reflectivity. An alignment system may use these varying degrees of reflectivity for more precise alignment of the integrate circuit.

A process may also have additional layers such as added metal and via layers. This additional layers may be cored and stacked on the already cored, nonplanar regions to further enhance the rough topography.

The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. An alignment structure formed in a planarized semiconductor process comprising:
    a substrate;
    a first topographical region on the substrate; and
    a second topographical region on the substrate adjacent to the first topographical region, the second topographical region having a different optical reflectiveness than the first topographical region, the second topographical region comprising:
        a contact opening formed on the substrate; and
        a first plug layer filling the contact opening, the first plug layer having a first depressed region in the contact opening, whereby a topographical roughness formed by the first depressed region scatters incident radiation.

2. The alignment structure of claim 1 wherein the topographical roughness contrasts reflectively to a topographically smooth region included in the first topographical region.

3. The alignment structure of claim 1 wherein the first depressed region is in about a middle of the contact opening.

4. The alignment structure of claim 1 further comprising:
    a first via opening stacked on top of the contact opening, whereby the first via opening enhances the topographical roughness formed by the first depressed region.

5. The alignment structure of claim 4 further comprising:
    a second via opening stacked on top of the first via opening and second via opening, whereby the second via opening further enhances the topographical roughness.

6. The alignment structure of claim 1 wherein the contact opening is larger than a minimum size specified by a design rule.

7. An alignment structure comprising:
    a smooth region formed on a substrate, the smooth region characterized by a first optical reflectiveness value; and
    a rough region formed on the substrate, the rough region characterized by a second optical reflectiveness value different from the first optical reflectiveness value, the rough region comprising:
        a first conductive layer;
        a second conductive layer formed above the first conductive layer,
        an first insulating layer, between the first and second conductive layers, wherein the first insulating layer has a first opening for electrically coupling the first and second conductive layers; and
        a plug layer filling the first opening, wherein the first plug layer has a cored region, whereby a topographical roughness formed by the cored region scatters incident radiation.

8. The alignment structure of claim 7 wherein the rough region further comprises:
    a third conductive layer formed above the second conductive layer; and
    a second insulating layer, between the second and third conductive layers, wherein the second conductive layer has a second opening, stacked above the first opening, for electrically coupling the third and second conductive layers, whereby the second opening aggravates the topographical roughness formed by the cored region.

9. The alignment structure of claim 7 wherein the cored region creates a void above the cored region and second conductive layer.

10. The alignment structure of claim 8 wherein the opening has a lateral dimension at least about 1.5 times larger than a minimum size.

11. The alignment structure of claim 8 wherein a passivation layer, covering the substrate, is removed from the rough region to enhance a reflectivity contrast between the rough region and smooth region.

12. The alignment structure of claim 8 wherein the smooth region is adjacent to the rough region.

13. The alignment structure of claim 8 wherein the smooth region is formed using a metal layer.

14. The alignment structure of claim 1 wherein:
    the first topographical region comprises a first portion and a second portion, wherein the first portion of the first topographical region is perpendicular to the second portion of the first topographical region; and
    the second topographical region comprises a first portion and a second portion, wherein the first portion of the second topographical region is adjacent to the first portion of the first topographical region, and the second portion of the second topographical region is adjacent to the second portion of the first topographical region.

15. The alignment structure of claim 7 wherein:

the smooth region comprises a first portion and a second portion, wherein the first portion of the smooth region is perpendicular to the second portion of the smooth region; and the rough region comprises a first portion and a second portion, wherein the first portion of the rough region is adjacent to the first portion of the smooth region, and the second portion of the rough region is adjacent to the second portion of the smooth region.

16. An integrated circuit comprising:

an alignment structure formed using a planarized process, the alignment structure comprising:
  a substrate;
  a first region formed on the substrate, the first region characterized by a first optical reflectiveness value; and
  a second region formed on the substrate adjacent to the first region, the second region characterized by a second optical reflectiveness value different from the first optical reflectiveness value;
  wherein the alignment structure is used to align the integrated circuit.

17. The integrated circuit of claim 16 wherein the second region comprises:

a first conductive layer;

a second conductive layer formed above the first conductive layer, an first insulating layer, between the first and second conductive layers, wherein the first insulating layer has a first opening for electrically coupling the first and second conductive layers; and a plug layer filling the first opening, wherein the first plug layer has a cored region, whereby a topographical roughness formed by the cored region scatters incident radiation.

18. The integrated circuit of claim 17 wherein the second region further comprises:

a third conductive layer formed above the second conductive layer; and a second insulating layer, between the second and third conductive layers, wherein the second conductive layer has a second opening, stacked above the first opening, for electrically coupling the third and second conductive layers, whereby the second opening aggravates the topographical roughness formed by the cored region.

19. The integrated circuit of claim 16 wherein the second region comprises:

a contact opening formed on the substrate; and a first plug layer filling the contact opening, the first plug layer having a first depressed region in the contact opening, whereby a topographical roughness formed by the first depressed region scatters incident radiation.

20. The integrated circuit of claim 19 wherein the second topographical region comprises:

a first via opening stacked on top of the contact opening, whereby the first via opening enhances the topographical roughness formed by the first depressed region; and a second via opening stacked on top of the first via opening and second via opening, whereby the second via opening further enhances the topographical roughness.

* * * * *